United States Patent
Trehan

[19]

[11] Patent Number: 6,116,615
[45] Date of Patent: Sep. 12, 2000

[54] COMPOSITE WEATHER AND ELECTROMAGNETIC RADIATION GASKET FOR ELECTRONIC CABINETS

[75] Inventor: Anil K. Trehan, Whippany, N.J.

[73] Assignee: Lucent Technologies, Inc, Murray Hill, N.J.

[21] Appl. No.: 09/127,835

[22] Filed: Aug. 4, 1998

[51] Int. Cl.[7] .............................. F16J 15/02; E06B 7/22; H05K 9/00
[52] U.S. Cl. ........................ 277/630; 277/645; 277/920; 277/921; 49/498.1; 174/35 R
[58] Field of Search ................................. 49/490.1, 498.1; 174/35 GC, 35 R; 277/630, 645, 920, 921

[56] References Cited

U.S. PATENT DOCUMENTS

| | | | |
|---|---|---|---|
| 3,140,342 | 7/1964 | Ehrreich et al. | 277/920 |
| 3,752,899 | 8/1973 | Bakker | 277/920 |
| 4,308,302 | 12/1981 | Etter et al. | 49/498.1 |
| 4,399,317 | 8/1983 | Van Dyk, Jr. | 277/920 |
| 5,045,635 | 9/1991 | Kaplo et al. | 174/35 R |
| 5,107,071 | 4/1992 | Nakagawa | 277/920 |
| 5,120,903 | 6/1992 | Tam | 277/920 |
| 5,194,691 | 3/1993 | McIlwraith | 174/35 R |
| 5,575,485 | 11/1996 | Merla et al. | 277/921 |

*Primary Examiner*—Anthony Knight
*Assistant Examiner*—Vishal Patel
*Attorney, Agent, or Firm*—Michael Y. Epstein; Henry I. Schanzer

[57] ABSTRACT

A composite gasket for the door of an outdoor, electronic component containing cabinet includes a known type of gasket including an elongated hollow tubing for mounting on a door jamb of the cabinet, and a supplemental gasket of an electrically conductive material fixedly secured to one side of the hollow tubing and coextensive therewith entirely around the periphery of the door jamb. The known gasket provides a weather seal for the door. The supplemental gasket spans the gap between the door and the jamb established by the weather gasket for electrically interconnecting the door to the jamb and for sealing the door joint against electromagnetic radiations. The supplemental gasket is disposed entirely within the weather sealed space of the cabinet when the door is closed, and is so arranged as to provide no interference with the weather seal formed upon closing of the door.

8 Claims, 4 Drawing Sheets

COMPOSITE WEATHER AND ELECTROMAGNETIC RADIATION GASKET FOR ELECTRONIC CABINETS

BACKGROUND OF THE INVENTION

This invention relates to cabinets housing electronic components, and particularly to gaskets for sealing the doors of such cabinets against ambient conditions, particularly both outdoor weather and electromagnetic radiations.

In telephone networks and the like, a common practice is to house various electronic components within cabinets disposed at sites spaced throughout the network. Many of the cabinets stand in the open and provide the sole protection of the components from the outside weather. For periodic servicing of the housed components, the cabinets are provided with doors. In general, quite adequate gaskets exist for essentially hermetically sealing the doors against outdoor weather conditions when the doors are closed. A problem, however, is that the known weather gaskets are of materials which are transparent to electromagnetic radiations (EMR). For preventing passage of such radiations into and out of the cabinet through the door seals, supplemental electromagnetic shielding gaskets are used.

Originally, two separate gaskets were used, each being individually mounted in place along the cabinet door jamb. Attempts have recently been made, however, to combine the two gaskets into a single gasket, particularly for reducing the labor for mounting the two gaskets in place. U.S. Pat. No. 5,147,121, to McIlwraith, for example, discloses one such composite gasket and briefly summarizes the disclosures of a number of other patents directed to related gaskets (the subject of all these U.S. patents being incorporated herein by reference). The McIlwraith patent describes various shortcomings of the referenced patents and, in turn, it is herein noted that the McIlwraith gasket arrangement is somewhat less than desirable owing to its fairly complicated and expensive structure. Also, based upon actual experience with the McIlwraith gasket, it is relatively fragile and relatively easily broken.

Gaskets according to the present invention are robust in structure, relatively inexpensive, and relatively easily mounted in place.

SUMMARY OF THE INVENTION

A dual purpose, composite gasket comprises a first gasket of known type including an elongated hollow tubing for forming an environmental joint between a cabinet door, when closed, and a door jamb, and a second gasket for forming an electromagnetic radiation (EMR) interference shield comprising an elastic, electrically conductive member secured along one side of the first gasket hollow tubing and coextensive therewith. The EMR gasket spans the thickness of the environmental joint and electrically contacts both the cabinet door and the door jamb for providing EMR shielding of the joint. While providing such EMR shielding, the second gasket is so shaped, and so mounted on the environmental gasket, as hereinafter described, that both gaskets work with full efficiency for achieving their respective sealing functions.

DESCRIPTIONS OF THE DRAWINGS

Figure 3:
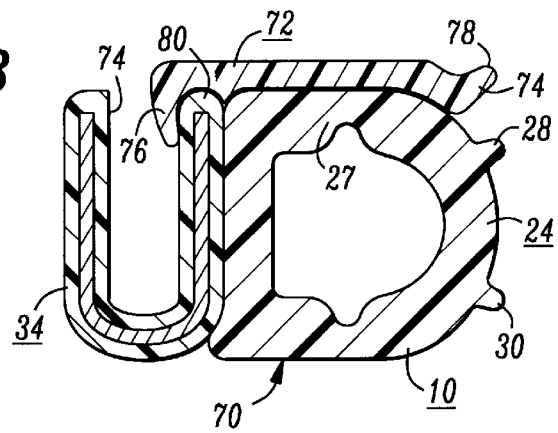
FIG. 3 is a sectional view of a composite gasket in accordance with the invention; the composite gasket, in this embodiment, incorporating the known gasket shown in FIG. 2.
Figure 4:
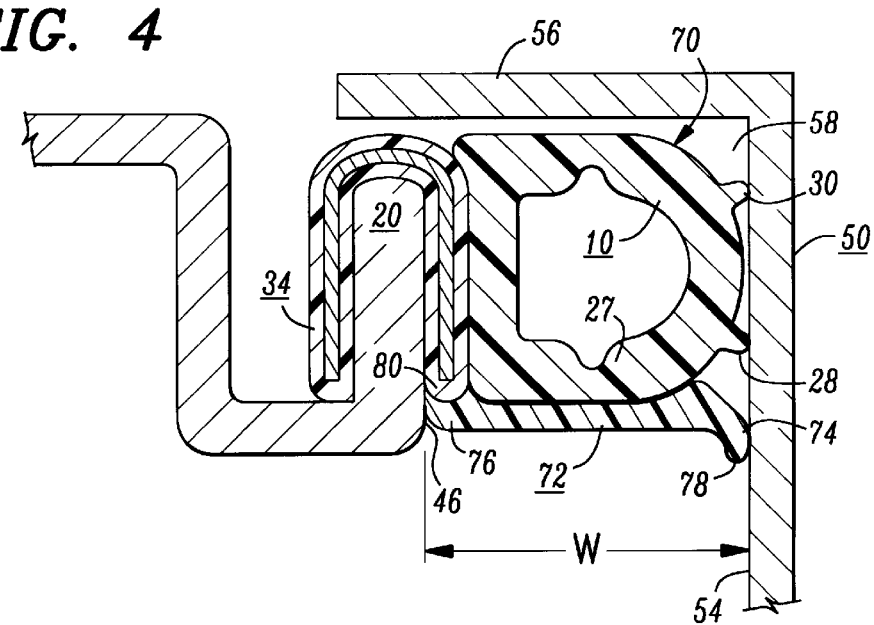

FIG. 4 is similar to FIG. 3 but showing the composite gasket mounted on a jamb and in contact with a surface of a closed door of the cabinet; and FIGS. 5 and 6 and FIGS. 7 and 8 are similar to FIGS. 3 and 4, respectively, but showing two additional composite gaskets in accordance with the invention.

DESCRIPTION OF PREFERRED EMBODIMENTS

The composite gaskets according to the invention are primarily intended for use with known electronic cabinets having doors which, when closed, are sealed by known gaskets of elastomeric materials, e.g., ethylene propylene diene monomer (EPDM) rubber. Typically, the cabinets are outdoor cabinets sealed against the ambient weather. Other uses for the gasket are possible. A typical known gasket 10 is shown in FIG. 1 for being mounted on a cabinet door jamb 12.

Figure 1:
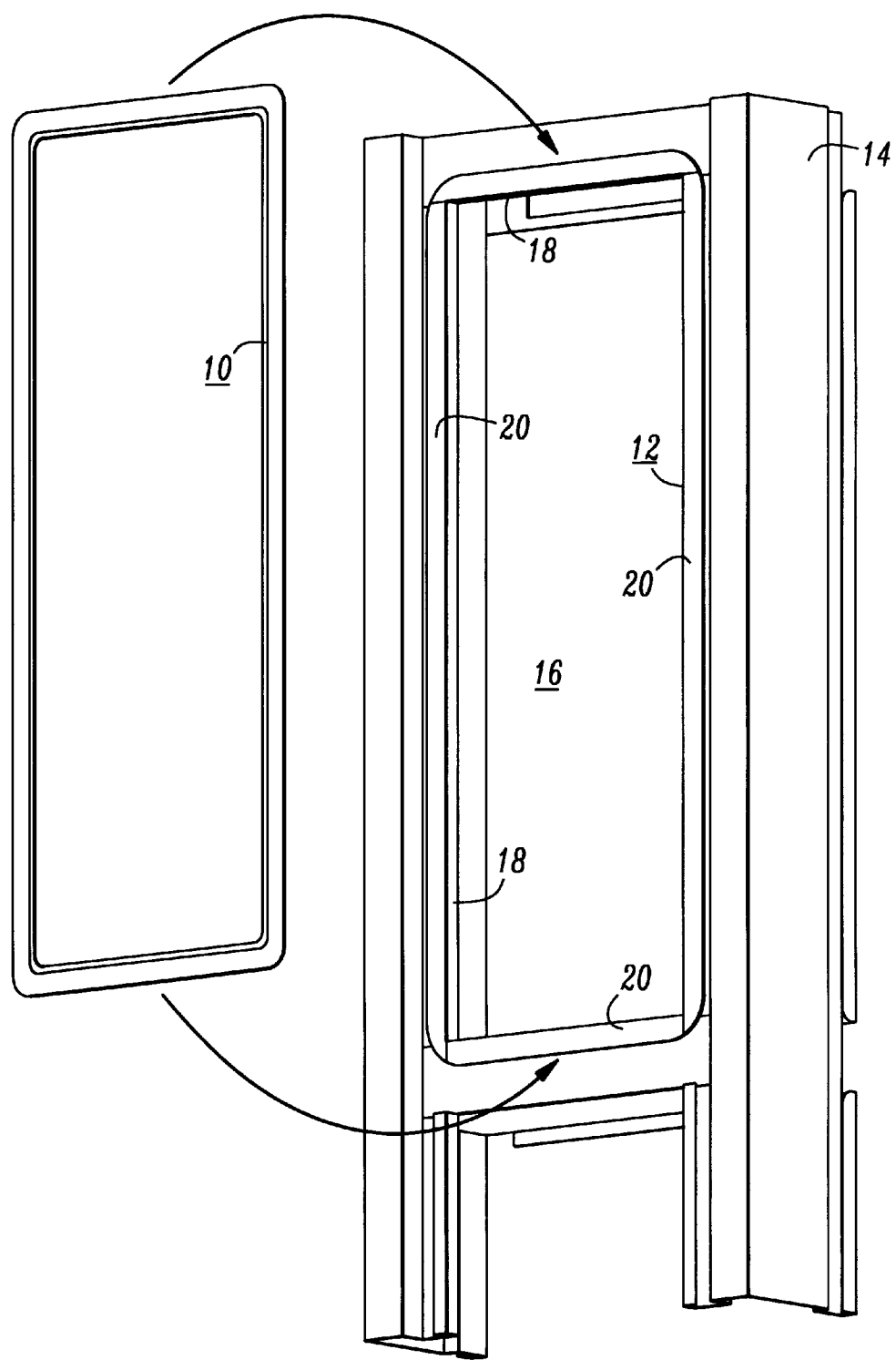
FIG. 1 is a view, in perspective and partially exploded, of a frame portion of a known type of outdoor cabinet, the frame including a door jamb and a known type of weather gasket mounted on the door jamb.

The door jamb 12 shown in FIG. 1 is integral with a metal frame 14 forming a sealed portion of the outer wall (not shown) of a cabinet. (Electronic cabinets with which the present invention can be used are known; one such cabinet being shown in the aforementioned U.S. Pat. No. 5,147, 121.) The door jamb 12 surrounds an opening 16 into the cabinet which is closed by a cabinet door (not shown in FIG. 1, but partially shown in FIG. 2).

The door jamb 12 shown in FIG. 1 is typical of known cabinet door jambs and, while somewhat difficult to see in FIG. 1, the door jamb projects slightly forwardly from the frame 14 and comprises (see, also, FIG. 2) a wall 18 extending completely around the cabinet opening 16 and projecting forwardly from the frame 14. The wall 18 terminates in a flange 20 also completely encircling the opening 16 but extending in a direction away from the opening 16. The gasket 10 is mounted directly on the flange 20 and is compressed against the flange 20 by contact with a flat surface of a closed door, the gasket 10 thus providing an environmental seal or joint between the door jamb flange 20 and the cabinet door (mounted on hinges for parallel, closed relation with the door jamb 12). By "environmental" is meant, typically, the outside weather or, more generally, any surrounding conditions.

The known gasket 10 comprises (FIG. 2) an elongated, hollow tubing 24 having an "outwardly", door facing surface portion 26 along which are disposed two elongated ribs 28 and 30. Opposite to the outwardly facing portion 26 is an "inwardly" facing portion 32 secured to an elongated U-shaped clip portion 34 of a relatively rigid and elastic construction. Typically, the clip portion 34 comprises an elongated U-shaped metal clip 36 embedded within a protective sheath 38 of, e.g., the aforementioned (EPDM) rubber. The gasket 10 is mounted on the jamb 12 by force fitting the gasket clip 34 onto the ledge 20.

Figure 2:
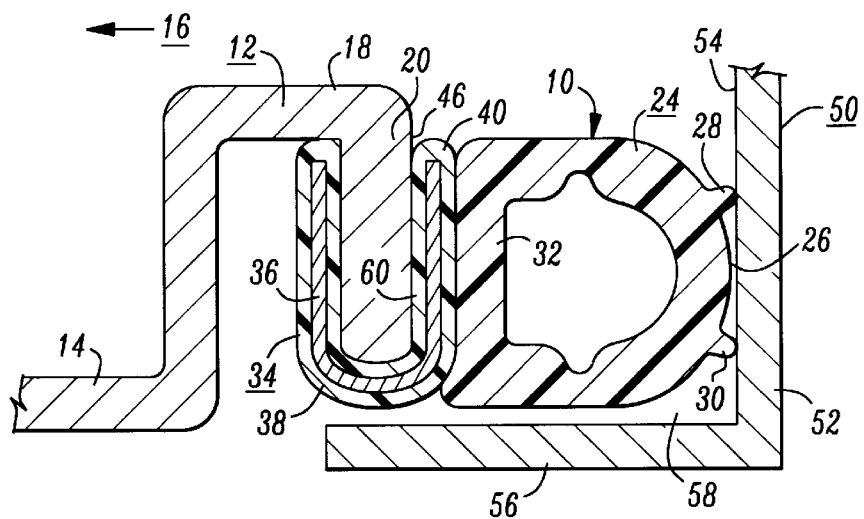
FIG. 2 is a sectional view of a known type of weather gasket used on the door jamb shown in FIG. 1 and showing a portion of a cabinet door closed against the gasket.

When a door 50 (only a portion 52 thereof being shown in FIG. 2) of the cabinet is closed, a flat surface 54 of the door 50 engages the ribs 28 and 30 on the outwardly facing surface portion 26 of the gasket tubing 24. As shown in FIG. 2, the contacting door portion 52 is L-shaped. The L shaped door portion 52 is quite rigid and provides a firm flat surface 54 for uniform contacting with the gasket 10 completely around the cabinet opening 16. The projecting ledge 56 of the door portion 52 does not contact either the door jamb 12 or the gasket 10, but serves to enclose these parts both for mechanical protection and for almost, but not complete, EMR shielding.

When the door 50 closes against the ribs on the gasket outer surface 26, the gasket tubing 24 is slightly compressed for wedging the gasket ribs 28 and 30, as well as a portion of the gasket surface 26, against the door surface 54. The compressive engagement of these portions of the gasket 10 securely seals the gasket to the door. The compression of the gasket tubing 24 by the door surface 54 also compresses the inside surface 60 of the gasket clip 34 against the door jamb ledge 20 for weather sealing therebetween. Although not shown in FIG. 2, the inside surface 60 of the clip 34 is typically provided with an extending rib similar in shape to the ribs 28 and 30 on the gasket outer surface. Such "inside" rib is typically an integral extension of the sheath 38 of the clip, and the rib is flattened against the door jamb ledge 20 for more secure weather sealing.

For a reason hereinafter explained, it is noted that, in FIG. 2, a space 58 within a corner of the door portion 52 is "outside" the cabinet and exposed to outside weather.

As mentioned, the known gasket 10 is generally quite adequate for providing sealing of the door joint against outdoor weather. However, the known materials used for known type door gaskets are transparent to electromagnetic radiations, and the practice is to provide a supplemental gasket for sealing the door joint against such radiations. While such supplemental gaskets are known, improved composite gaskets are now described in connection with FIGS. 3 through 8.

In each of the inventive embodiments shown, a supplemental EMR shielding member is integrally secured to a known type of gasket such as shown in FIGS. 1 and 2. Basically, in accordance with the invention, an elongated, electrically conductive member is mounted along one side of a known weather gasket in such manner as not to interfere with the weather sealing function of the known gasket while providing a radiation shield completely spanning the weather gasket and making an electrically conductive path between the door and the cabinet jamb. Additionally, the conductive member is disposed entirely within the weather sealed inner space of the cabinet and completely protected from the outside weather when the cabinet door is closed.

FIGS. 3 and 4 show a first embodiment of a composite gasket 70 in accordance with the invention incorporating the known gasket 10 shown in FIGS. 1 and 2. FIG. 3 shows the composite gasket 70 by itself, and FIG. 4 shows the composite gasket 70 mounted on the ledge 20 of a cabinet door jamb 12 and engaged by a closed door of the cabinet.

As shown in FIG. 3, an additional elastomeric material member 72 is secured to and along one side 27 of the known gasket 10. While not shown in a separate figure, the additional member 72 is co-extensive with the entire length of the gasket 10 for disposition completely around (FIG. 1) the periphery of the cabinet opening 16. The additional member 72 is both elastic and electrically conductive and can comprise a known material used for EMR shielding purposes, e.g., as a gasket separate and spaced from the weather gasket and mounted separately from the weather gasket on the door jamb. An example of such known material is a silicon rubber embedded with nickel and graphite particles.

As previously indicated, the purpose of the conductive member 72 is to seal the door joint against electromagnetic radiation. To this end, as shown in FIG. 4, the width W of the member 72 is such as to ensure a firm and low resistance contact of opposite sides 74 and 76 of the member 72 with electrically conductive surfaces 54 and 46 of the door 50 and the metal ledge 20, respectively.

The conductive member 72 is in the form of an elongated strip coextensive (as in FIG. 1) with the gasket 10 and firmly bonded, as with a known adhesive, to the side 27 of the gasket tubing 24 adjoining the open end 74 of the gasket clip 34. A non-conductive epoxy adhesive, such as cynoacrylate, can be used. One side 74 of the conductive member 72 comprises an elongated rib (also identified by reference numeral 74) projecting outwardly from the composite gasket 70 similarly as the first gasket ribs 28 and 30. In this embodiment, the outer end 78 of the conductive member rib 74 projects (FIG. 3) outwardly from the composite gasket a distance slightly greater than the projecting distance of at least one of the ribs 28 and 30. Thus, when a door 50 is closed (FIG. 4) against the composite gasket 70, the door surface 54 contacts the rib 74 of the conductive member 72 slightly prior to the full contacting of the door with the weather gasket sealing surfaces.

The reason for such sequence of contacting of the door surface with the various sealing surfaces of the composite gasket is described hereinafter. It is now noted, however, that such sequential contacting of the respective gasket surfaces is practical because of the relatively small size and elasticity of the thin, strip configuration of the conductive member 72. That is, owing to the high elasticity and softness of the conductive member 72, the presence of the member 72 does not interfere with the firm contacting of the door surface 54 with the gasket 10 for tight weather sealing of the door joints.

The edge 76 of the conductive member strip 72 opposite to the rib 74 wraps (FIG. 3) around an end 80 of the connector clip 34 of the gasket 10 and extends partly inwardly of the clip 34. When the composite gasket 70 is mounted in place, as shown in FIG. 4, the wrapped around edge portion 76 of the conductive member 70 is firmly pressed against an electrically conductive surface of the jamb ledge 20. (Typically, various metal surfaces of the metal structure are coated with a protective chromate finish covered, in turn, with a protective paint. The chromate finish is electrically conductive, but the paint is not. Where electrical contacting is needed, e.g., between the conductive member 72 and the cabinet door and the door jamb, the chromate finish is left exposed through the paint layer.)

With the door closed and the conductive member 72 spanning the gap between the door and the door jamb and being electrically connected to both, the door joint is fully sealed against electromagnetic radiations. Additionally, electrical noise picked up by the metal door is "grounded" to the cabinet frame via the gasket conductive member 72.

Comparing FIG. 4 with FIG. 2 (but noting that the composite gasket 70 of FIG. 4 is shown inverted relative to the gasket 10 of FIG. 2), and recalling that FIG. 2 distinguishes between cabinet "inside" (16) and "outside" (58) spaces, it is evident that the conductive member 72 in FIG. 4 is disposed entirely inside the cabinet when the door is closed. Thus, except for relatively short periods of time while the cabinet door is open, the conductive member 72 is protected from exposure to the outside weather for preventing deterioration of the member. This is important because, while both the gasket 10 and the conductive member 72 are of elastomeric materials, no single elastomeric material is presently known suitable for use over extended periods of time, e.g., 20 years, both as a weather resistant gasket and as an electrical conductor. In the composite gasket 70, each portion thus serves a particular sealing function with respect to either weather or electromagnetic radiation, and each gasket portion is made of a material most suitable for its function.

The fact that the conductive member 72 is entirely sealed within the cabinet for protecting it against the outdoor environment means that, when the door is closed, the EMR gasket can not be visually inspected to ensure the soundness of the seal between the conductive member 72 and the door. This, then, is the reason for arranging, as previously described, that the door closes against the conductive member rib 74 slightly before the door fully contacts the weather gasket 10. Thus, upon visible inspection of the weather joint portion 10 of the composite gasket, possible even when the door is closed, an observed proper sealing of the gasket 10 ensures that a proper sealing of the non-visible conductive member 72 is also achieved.

Figure 5:
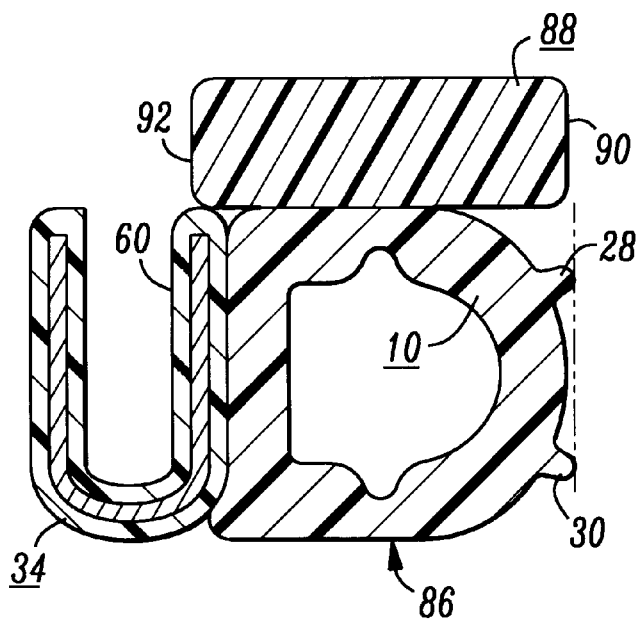
Figure 6:
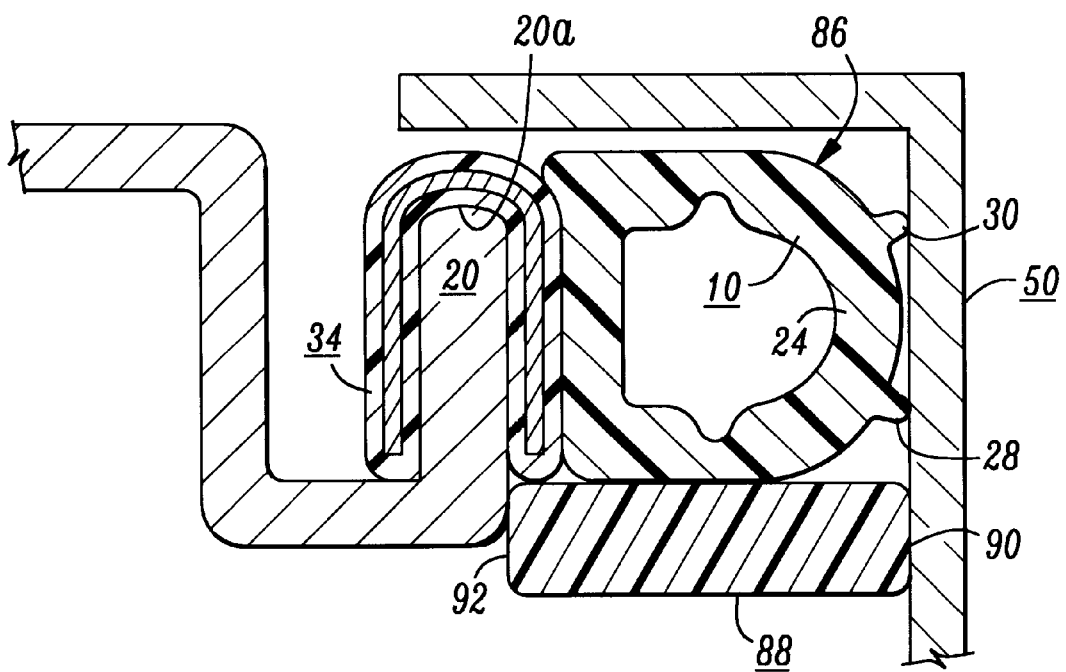

A second embodiment of the invention is shown in FIGS. 5 and 6. The composite gasket 86 shown is quite similar to the composite gasket 70 shown in FIGS. 3 and 4, and the gasket 10 shown in the FIGS. 3 and 4 embodiment can be used in the composite gasket 86. One difference is that the conductive member 88 of the composite gasket 86 comprises a compacted, woven mesh formed from metal wires over a very soft neoprene rubber core. The conductive member 88 can be of known type such as commonly used as a separate gasket separately mounted on a door jamb separate from a weather gasket for adding EMR shielding to known weather sealed cabinets. Because such conductive mesh EMR shielding members are known, structural details thereof are not shown.

Comparing FIG. 5 with FIG. 3, it is seen that the conductive member 88 has a simple rectangular cross-section and is not shaped with an extending rib 78 and clip wrapped around portion 76 as is the FIG. 3 conductive member 72. Contacting of the "outer" side 90 of the member 88 with a closed door 50 (FIG. 6) is obtained by positioning the conductive member 88 such that the side 90 thereof is substantially flush with the outer ends of the weather gasket ribs 28 and 30. The rubber mounted wire mesh conductive member 88 is also quite soft and elastic and should the door contact the member 88 slightly before it contacts the gasket 10, a quite satisfactory weather seal will still be obtained. However, while not critical, owing to the fact that the wire mesh conductive member 88 is somewhat more bulky than the strip-like conductive member 72 of FIG. 3, it is generally preferred that contact between the door and the weather gasket 10 occurs generally simultaneously with the contact of the door with the conductive member 88 or even slightly ahead of such contacting for minimizing any possible interference of the weather seal between the gasket 10 and the door.

For proper contacting and sealing of the conductive member mesh 88 with the door jamb, the member other side surface 92 is disposed slightly "outwardly" (i.e., to the right, as shown in FIG. 5) from the inner surface 60 of the gasket clip 34. This allows mounting of the gasket clip on (FIG. 6) the jamb ledge 20 without, during initial contacting of the clip 34 with the flange 20, abutting the conductive member 88 against the free edge 20*a* of the ledge 20. Upon closing of the door 50, and slight compression of the gasket tubing 24, the conductive member side surface 92 is pressed firmly against the jamb ledge 20 for completing the EMR sealing of the door joint.

Figure 7:
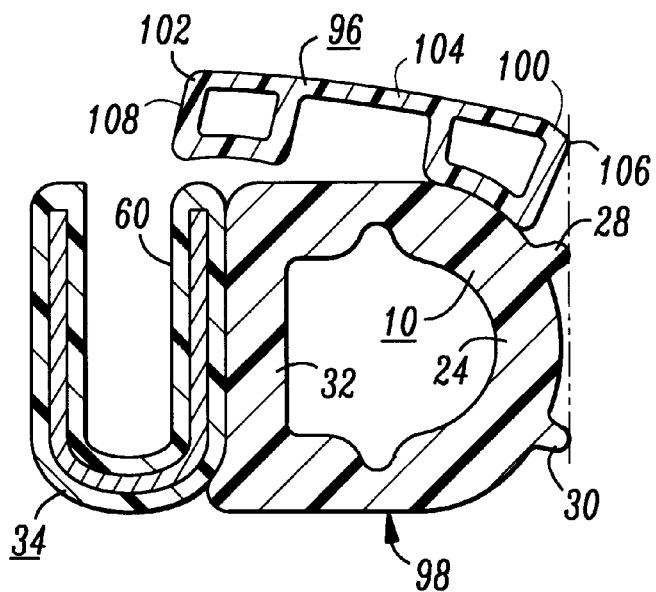
Figure 8:
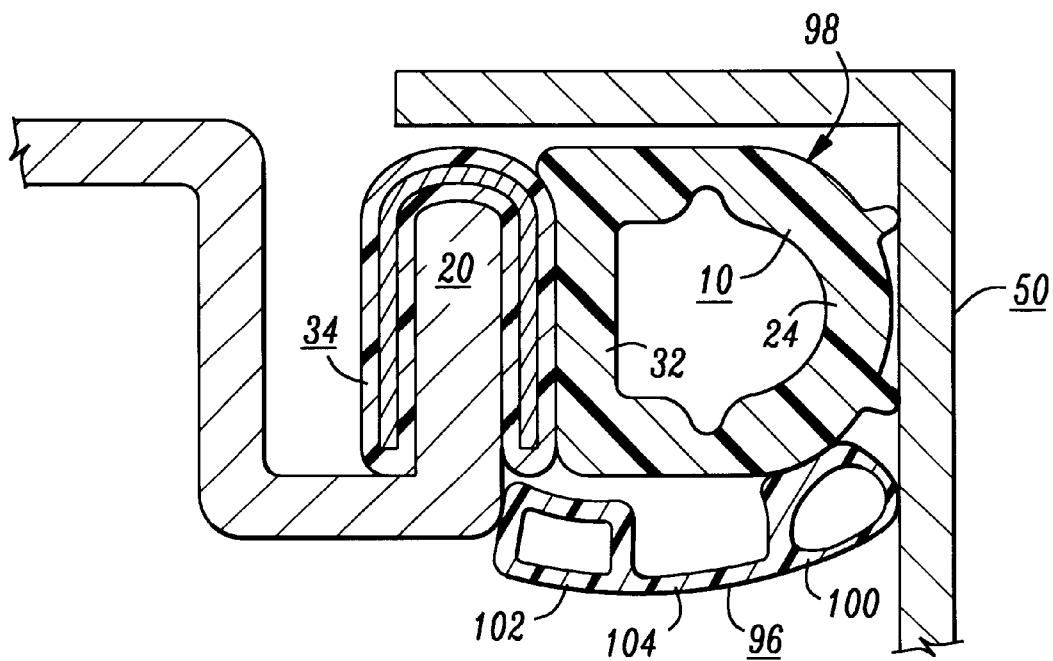

In a third embodiment of the invention, shown in FIGS. 7 and 8, the conductive member 96 of the composite gasket 98 (including the identical gasket 10 used in the first two described embodiments) comprises a pair of elongated hollow tubes 100 and 102 interconnected by an integral web 104. The member 96 can be of the same conductive, elastomeric material as the conductive member 72 shown in FIGS. 3 and 4. An advantage of the conductive member 96 is that the hollow tubes 100 and 102 provide great mechanical strength, for long life of the composite gasket 98, while still being of light weight and high elasticity. For increasing the elasticity of the member 96, only the "outer" tube 100 is fixedly attached to the tubing 24 of the gasket 10, the "inner" tube 102 thus being flexibly mounted relative to the tubing 24 by means of the web 104.

Each tube 100 and 102 is relatively soft and no less elastically compressible than the tubing 24, and the outer side edge 106 of the tube 100 functions as a rib terminating in the plane defined by the ends of the gasket ribs 28 and 30. Thus, upon closing of the door 50 (FIG. 8), the door contacts the gasket ribs 28 and 30 for firm weather sealing contact and simultaneously contacts the rib 106 of the tube 100 for electrical connection of the door to the EMR gasket 96.

The "inner" side surface 108 of the other tube 102 of the conductive member 96 is disposed (FIG. 8) slightly "inwardly" of the inner surface 60 of the inner leg 32 of the gasket clip 34. During the mounting of the composite gasket 98 on the door jamb by forcing the gasket clip 34 onto the jamb ledge 20 (FIG. 8), there is initial contact between the conductive member tube 102 (overlying the inner leg 32 of the clip 34) and the jamb ledge 20. However, owing to the cantilevered mounting of the tube 102 at the end of the web 104, the tube 102 pivots out of the way for allowing insertion of the clip 34 onto the ledge 20. Once mounted on the ledge 20, the flexed web 104 maintains the tube 102 pressed against the ledge 20 for firmly contacting the entire length of the tube 102 against the door jamb ledge 20.

What is claimed is:

1. A composite gasket for sealing a door of a cabinet against its surrounding environment and against electromagnetic radiations (EMR), the composite gasket comprising an elongated hollow tubing formed from an elastic material and having oppositely disposed first and second side surfaces separated by a tubing third surface, said first surface, when the cabinet door is closed, being compressively engaged with said door for providing environmental sealing therewith, and said second surface being compressively engaged with a door jamb of the cabinet establishing, when the door is closed, an environmentally sealed cabinet interior space, and an electrically conductive, elastic member fixedly secured at said third surface only of said elongated tubing and coextensive with the tubing along its direction of elongation, said conductive member having a dimension, along said tubing third surface, for providing a firm electrical interconnection between said door, when closed, and said door jamb for EMR sealing of said door to said jamb, said conductive member, when the door is closed, being entirely disposed within the environmentally sealed interior space of the cabinet, and said conductive member having a generally rectangular cross-section and being formed from a wire mesh, each of oppositely disposed side surfaces of said conductive member being generally coplanar with said first and second side surfaces, respectively, of said tubular member.

2. A composite gasket for sealing a door of a cabinet against its surrounding environment and against electromagnetic radiations (EMR), the composite gasket comprising an elongated hollow tubing formed from an elastic material and having oppositely disposed first and second side surfaces separated by a tubing third surface, said first surface, when the cabinet door is closed, being compressively engaged with said door for providing environmental sealing therewith, and said second surface being compressively engaged with a door jamb of the cabinet establishing, when the door is closed, an environmentally sealed cabinet interior space, and an electrically conductive, elastic member fixedly secured at said third surface only of said elongated tubing and coextensive with the tubing along its direction of elongation, said conductive member having a dimension, along said tubing third surface, for providing a firm electrical interconnection between said door, when closed, and said door jamb for EMR sealing of said door to said jamb, and said conductive member, when the door is closed, being entirely disposed within the environmentally sealed interior space of the cabinet, said tubing having a central axis of elongation, said tubing first surface including an elongated first rib projecting generally radially outwardly a first distance in a first direction, and said conductive member including an elongated second rib projecting generally radially outwardly in said first direction a second distance such that said first and second ribs are directly engaged with the door when closed.

3. A gasket according to claim 2 wherein said tubing second surface is attached to a leg of a clip for mounting the gasket on a door jamb, said leg has a free end, and an elongated second edge of said conductive member extends over the free end of said leg.

4. A gasket according to claim 3 wherein said conductive member second edge is wrapped around the free end of said leg for partial extension along a surface thereof.

5. A gasket according to claim 2 wherein said tubing first surface includes an elongated second rib spaced by a portion of said first surface from said first rib and projecting radially outwardly in said first direction a third distance such that said second rib and said portion of said first surface are directly engaged with the door when closed.

6. A composite gasket for sealing a door of a cabinet against its surrounding environment and against electromagnetic radiations (EMR), the composite gasket comprising an elongated hollow tubing formed from an elastic material and having oppositely disposed first and second side surfaces separated by a tubing third surface, said first surface, when the cabinet door is closed, being compressively engaged with said door for providing environmental sealing therewith, and said second surface being compressively engaged with a door jamb of the cabinet establishing, when the door is closed, an environmentally sealed cabinet interior space, and an electrically conductive, elastic member fixedly secured at said third surface only of said elongated tubing and coextensive with the tubing along its direction of elongation, said conductive member having a dimension, along said tubing third surface, for providing a firm electrical interconnection between said door, when closed, and said door jamb for EMR sealing of said door to said jamb, said conductive member, when the door is closed, being entirely disposed within the environmentally sealed interior space of the cabinet, said tubing second surface being attached to a leg of a clip f or mounting the gasket on a door jamb, said leg having a free end and a fourth surface for being directly engaged with a surface of said door jamb with said jamb surface including a portion extending beyond the free end of said leg, said conductive member having a generally rectangular cross-section formed from a wire mesh and having oppositely disposed fifth and sixth surfaces, said fifth surface being generally coplanar with said tubing first surface such that said tubing first surface and said conductive member fifth surface are directly engaged with said door when closed, and said sixth surface of said conductive member extends over the free end of said leg such that said conductive member is compressively engaged with said jamb surface portion when the door is closed.

7. A gasket according to claim 6 wherein said tubing has a central axis of elongation, said tubing first surface includes an elongated first rib projecting generally radially outwardly a first distance and in a first direction such that said first rib is directly engaged with the door when closed.

8. A gasket according to claim 7 wherein said tubing first surface includes an elongated second rib spaced by a portion of said first surface from said first rib and projecting radially outwardly in said first direction a second distance such that said third rib and said portion of said first surface are directly engaged with the door when the door is closed.

\* \* \* \* \*